(12) United States Patent
Morris et al.

(10) Patent No.: US 7,092,165 B2
(45) Date of Patent: Aug. 15, 2006

(54) MICROLENS ARRAYS HAVING HIGH FOCUSING EFFICIENCY

(75) Inventors: G. Michael Morris, Victor, NY (US); Tasso R. M. Sales, Rochester, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 11/016,185

(22) Filed: Dec. 17, 2004

(65) Prior Publication Data

US 2005/0146795 A1 Jul. 7, 2005

Related U.S. Application Data

(62) Division of application No. 09/918,257, filed on Jul. 30, 2001, now Pat. No. 6,835,535.

(60) Provisional application No. 60/222,032, filed on Jul. 31, 2000.

(51) Int. Cl.
*G02B 27/10* (2006.01)
(52) U.S. Cl. ........................ 359/626; 359/619
(58) Field of Classification Search ................ 359/626, 359/625, 619
See application file for complete search history.

(56) References Cited

U.S. PATENT DOCUMENTS

| | | | |
|---|---|---|---|
| 1,942,841 A | 1/1934 | Shimizu | |
| 2,338,654 A | 1/1944 | Mac Neille | |
| 2,358,070 A | 9/1944 | Holmes et al. | |
| 2,362,573 A | 11/1944 | Mac Neille | |
| 2,618,198 A | 11/1952 | Luboshez | |
| 2,804,801 A | 9/1957 | Mihalakis | |
| 2,984,152 A | 5/1961 | Mihalakis | |
| 3,063,339 A | 11/1962 | Mihalakis et al. | |
| 3,994,562 A | 11/1976 | Holzel | |
| 4,172,219 A | 10/1979 | Deml et al. | |
| 4,241,980 A | 12/1980 | Mihalakis et al. | |
| 4,372,649 A | 2/1983 | Kellie | |
| 4,427,265 A | 1/1984 | Suzuki et al. | |
| 4,464,030 A | 8/1984 | Gale et al. | |
| 4,490,010 A | 12/1984 | Honda et al. | |
| 4,496,216 A | 1/1985 | Cowan | |
| 4,536,056 A | 8/1985 | Oguino | |
| 4,609,259 A | 9/1986 | Suemitsu et al. | |
| 4,666,248 A | 5/1987 | van de Ven | |
| 4,668,080 A | 5/1987 | Gale et al. | |

(Continued)

FOREIGN PATENT DOCUMENTS

EP         0 311 189         4/1989

(Continued)

OTHER PUBLICATIONS

*Micro-Optics: Elements, systems and applications*, Hans P. Herzig, ed., Taylor & Francis, Bristol, PA, 1997, pp. 53-152.

(Continued)

*Primary Examiner*—Jordan M. Schwartz
(74) *Attorney, Agent, or Firm*—Maurice M. Klee; Ronald J. Paglierani

(57) ABSTRACT

Microlens arrays (105) having high focusing efficiencies are provided. The high focusing efficiencies are achieved by accurately producing the individual microlenses making up the array at high fill factors. Arrays of positive microlenses are produced by forming a master having a concave surface-relief pattern (101) in a positive photoresist (21) using direct laser writing. Through this approach, the problems associated with the convolution of a finite laser beam with a desired profile for a microlens are overcome. The microlens arrays of the invention have focusing efficiencies of at least 75%.

6 Claims, 11 Drawing Sheets

U.S. PATENT DOCUMENTS

| | | | |
|---|---|---|---|
| 4,689,291 A | 8/1987 | Popovic et al. | |
| 4,767,186 A | 8/1988 | Bradley, Jr. et al. | |
| 4,826,292 A | 5/1989 | Spohr et al. | |
| 4,882,262 A | 11/1989 | Wilwerding | |
| 5,080,706 A | 1/1992 | Snyder et al. | |
| 5,081,545 A | 1/1992 | Sugawara et al. | |
| 5,085,977 A | 2/1992 | Sugawara et al. | |
| 5,104,435 A | 4/1992 | Oikawa et al. | |
| 5,119,235 A | 6/1992 | Umeda et al. | |
| 5,148,322 A | 9/1992 | Aoyama et al. | |
| 5,155,631 A | 10/1992 | Snyder et al. | |
| 5,177,637 A | 1/1993 | Tsukada | |
| 5,279,689 A | 1/1994 | Shvartsman | |
| 5,298,366 A | 3/1994 | Iwasaki et al. | |
| 5,300,263 A | 4/1994 | Hoopman et al. | |
| 5,324,623 A | 6/1994 | Tsumori | |
| 5,401,968 A | 3/1995 | Cox | |
| 5,439,621 A | 8/1995 | Hoopman | |
| 5,442,482 A | 8/1995 | Johnson et al. | |
| 5,453,876 A | 9/1995 | Hamada | |
| 5,471,327 A | 11/1995 | Tedesco et al. | |
| 5,504,602 A | 4/1996 | Farmer | |
| 5,534,386 A | 7/1996 | Petersen et al. | |
| 5,536,455 A | 7/1996 | Aoyama et al. | |
| 5,609,939 A | 3/1997 | Petersen et al. | |
| 5,620,814 A | 4/1997 | Kley | |
| 5,631,754 A | 5/1997 | Jannson et al. | |
| 5,694,246 A | 12/1997 | Aoyama et al. | |
| 5,695,895 A | 12/1997 | Johnson et al. | |
| 5,699,190 A | 12/1997 | Young et al. | |
| 5,715,022 A | 2/1998 | Takamatsu et al. | |
| 5,718,830 A | 2/1998 | Hlinka et al. | |
| 5,728,509 A | 3/1998 | Eda et al. | |
| 5,731,857 A | 3/1998 | Neijzen | |
| 5,733,710 A | 3/1998 | Kuboya et al. | |
| 5,764,310 A | 6/1998 | Yamagishi | |
| 5,808,657 A | 9/1998 | Kurtz et al. | |
| 5,861,990 A | 1/1999 | Tedesco | |
| RE36,113 E | 2/1999 | Brueck et al. | |
| 5,867,307 A | 2/1999 | Myers et al. | |
| 5,867,321 A | 2/1999 | Nakama et al. | |
| 5,870,224 A | 2/1999 | Saitoh et al. | |
| 5,871,653 A | 2/1999 | Ling | |
| 5,886,760 A | 3/1999 | Ueda et al. | |
| 5,982,552 A | 11/1999 | Nakama et al. | |
| 6,014,259 A * | 1/2000 | Wohlstadter | 359/619 |
| 6,034,817 A | 3/2000 | Mihalakis | |
| 6,226,131 B1 | 5/2001 | Son et al. | |
| 6,285,503 B1 | 9/2001 | Chao et al. | |
| 6,301,051 B1 | 10/2001 | Sankur | |
| 6,317,263 B1 | 11/2001 | Moshrefzadeh et al. | |
| 6,429,919 B1 | 8/2002 | Takatsuka et al. | |
| 6,437,918 B1 * | 8/2002 | Hamanaka et al. | 359/620 |
| 6,490,086 B1 * | 12/2002 | Morishima | 359/443 |
| 6,835,535 B1 | 12/2004 | Gretton et al. | |
| 2002/0034710 A1 | 3/2002 | Morris et al. | |

FOREIGN PATENT DOCUMENTS

| | | |
|---|---|---|
| GB | 2 223 861 | 4/1990 |
| JP | 54-083846 | 4/1979 |
| JP | 63-221329 | 9/1988 |
| JP | 03-122614 | 5/1991 |
| JP | 3-192232 | 8/1991 |
| JP | 03-214101 | 9/1991 |
| JP | 03-230511 | 10/1991 |
| JP | 4-119339 | 4/1992 |
| JP | 4-220631 | 8/1992 |
| JP | 5-053174 | 3/1993 |
| JP | 06-160606 | 6/1994 |
| JP | 8-190135 | 7/1996 |
| JP | 8-248403 | 9/1996 |
| JP | 09-327860 | 12/1997 |
| JP | 11-101902 | 4/1999 |
| JP | 11-142609 | 5/1999 |
| JP | 11-344602 | 12/1999 |
| JP | 2000-035616 | 2/2000 |
| JP | 2001074918 A * | 3/2001 |
| WO | WO 99/050914 | 10/1999 |
| WO | WO 99/052105 | 10/1999 |
| WO | WO 99/64929 | 12/1999 |

OTHER PUBLICATIONS

Hutley, M.C., "Optical techniques for the generation of microlens arrays," Journal of Modern Optics, 37:253-265, 1990.

Computer translation for JP 2001-074918.

* cited by examiner

MICROLENS ARRAYS HAVING HIGH FOCUSING EFFICIENCY

CROSS REFERENCE TO RELATED APPLICATIONS

This application is a division of U.S. application Ser. No. 09/918,257 filed on Jul. 30, 2001, now U.S. Pat. No. 6,835,535, which claims the benefit under 35 USC §119(e) of U.S. Provisional Application No. 60/222,032 filed on Jul. 31, 2000, and which was published as U.S. Patent Publication No. 2002-0034014 A1 on Mar. 21, 2002, the contents of which in their entireties are hereby incorporated by reference.

I. FIELD OF THE INVENTION

The present invention relates to arrays of microlenses having high focusing efficiencies. It also relates to methods for fabricating such arrays.

The invention is applicable to the efficient focusing of laser light into optical fibers, light diffusion, and controlled scattering of coherent or incoherent light for projection and transmissive displays, among other applications.

II. DEFINITIONS

The following definitions are used herein:

A "microlens array" is an array of microlenses and an associated array of unit cells, with one microlens being associated with each unit cell. The microlenses of the present invention can have any desired configuration and can be formed on, for example, a supporting "piston" of the type disclosed in commonly assigned U.S. Patent Application No. 60/222,033 which was filed on Jul. 31, 2000 in the names of G. Michael Morris and Tasso R. M. Sales and is entitled "Structured Screens for Controlled Spreading of Light," the content of which in its entirety is incorporated herein by reference. Thus, as used herein, the term "microlens" means any microstructure which is capable of focusing light.

The "fill factor" of a microlens array is the ratio of the sum of the areas within the unit cells occupied by microlenses to the sum of the areas of the unit cells.

The "focusing efficiency" of a microlens array is the sum of the measured light intensities at the focal points of the microlenses divided by the sum of the light intensities impinging on the unit cells of the array for an array illuminated along its optical axis by a collimated, substantially spatially incoherent light source, e.g., a collimated white light source. As will be recognized by those skilled in the art, this is a "Strehl-type" definition of focusing efficiency.

Since concave microlenses will typically have virtual focal points (e.g., a plano-concave microlens in air will have a negative power and thus a virtual focal point for collimated light), an auxiliary optical system needs to be used in such cases to produce real focal points whose intensities can be measured. To at least some extent, the auxiliary optical system will reduce the intensities at the real focal points, and those reductions should be taken into account in determining the intensity values for the virtual focal points.

In the case of anamorphic microlenses, the light intensities at each of the focal points of the microlens are included in the sum of the measured light intensities.

III. BACKGROUND OF THE INVENTION

Microlenses are required in many applications, such as light coupling from lasers to fibers, either as single lenses or in array form whereby several beams are focused to several fibers. Other important applications include light diffusion and screens.

Depending on the application, one may require a microlens of accurate profile with controlled focusing properties or, in the case of an array, high quality over most lenses in the array. To focus light efficiently, the lens profile (or sag function) must be fabricated with accuracy typically equal to or better than, for example, $\lambda/4$, where $\lambda$ is the wavelength of the illumination source.

In addition, particularly for high-density coupling, diffusion, or screen applications, it is often important that the microlenses utilize the entire surface for focusing. In this way, essentially all incident light can be controlled by the array. When the entire useful surface area is employed for focusing, the array is said to possess a 100% fill factor.

Close packing of microlenses implies a fill factor equal to 100%, which means that the internal boundaries between neighboring microlenses are in close contact. A simple example of close packing is a hexagonal array. Other arrangements, such as square arrays, can also be close packed.

It is typical to find in both the scientific and patent literature arrays of microlenses that have fill factors below 100%. FIG. 1 illustrates such an array where microlenses 12 are regularly placed on the available substrate area 11 with spaces being left between the individual microlenses. One of the unit cells of the array of FIG. 1 is shown by dashed lines 13. The fill factor for this array is only 44%.

There are several existing methods for fabricating isolated microlens units or arrays of microlenses whose edges are well-separated so that their boundaries avoid close contact. Because there is a finite distance between the internal boundaries of neighboring lenses, the fill factor for the array is necessarily less than 1 (or 100%).

The difficulty in obtaining efficient closed-packed lens arrays using prior art fabrication methods is due to the inability of those methods to preserve the boundaries of microlenses accurately, particularly for small and strongly focusing lenses.

Methods using thermal deformation, such as that disclosed in U.S. Pat. No. 5,324,623, are based on volume relaxation and thus cannot control the fusing of material at the internal boundaries between microlenses. With fusion there is distortion that reduces focusing capabilities. Thermal deformation methods are simple to implement but allow limited control of the individual microlens structures.

Other methods, such as those described in U.S. Pat. No. 5,300,263, involve the creation of mechanical molds that define receptacles for curable liquids. The liquid is poured into the receptacles and the natural surface tension creates a bowed surface that serves as the microlenses. The mold, with the various receptacles, defines the array arrangement. Due to the inherent limitation of this method in controlling the shape of the microlens units, its efficiency cannot be optimized for a general application. Other mechanical methods based on the direct ruling of individual microlenses, such as diamond turning, are better suited for the fabrication of individual microlenses rather than arrays.

Methods based on ion diffusion processes that provide gradient-index arrays, such as those described in U.S. Pat. No. 5,867,321, cannot provide a 100% fill factor, with the region between two neighboring microlenses being typically 20% of the microlens repetition spacing. Gradient-index arrays present a serious limitation for large-volume fabrication due to the intrinsically slow diffusion process.

Processes for producing microlens arrays using direct laser writing in a photoresist are known in the art. See commonly-assigned PCT Patent Publication No. WO 99/64929, Gale et al., U.S. Pat. No. 4,464,030, and *Micro-Optics: Elements, systems and applications*, Hans P. Herzig, ed., Taylor & Francis, Bristol, Pa., 1997, pp. 53–152. The photoresist of choice for such processes is a positive photoresist since compared to negative photoresists, positive photoresists are more widely available, have been subject to more intensive research and development work by photoresist manufacturers, and generally have higher resolution. However, as discussed in detail below, prior to the present invention, it has not been possible to produce arrays of positive microlenses having high focusing efficiencies at high fill factors using positive photoresists.

The present invention addresses the difficulties associated with the prior art by providing methods for fabricating microlens arrays having high focusing efficiencies through accurate microlens fabrication at high fill factors. The array can be arranged in any arbitrary way, such as square, hexagonal, or random. In addition, the methods allow the fabrication of microlenses of arbitrary shape as well as variable focusing power for different directions (anamorphic lenses).

IV. SUMMARY OF THE INVENTION

In view of the foregoing, the objects of the invention include at least some and preferably all of the following:

(1) the provision of fabrication methods for producing arrays of convex microlenses having high focusing efficiencies;

(2) the provision of arrays of convex and/or concave microlenses with greater than 75% focusing efficiency, preferably greater than 85% focusing efficiency, and most preferably greater than 95% focusing efficiency;

(3) the provision of methods for accurately fabricating arrays of convex microlenses at high fill factors; and/or (4) the provision of arrays of accurately fabricated convex and/or concave microlenses with fill factors greater than 90%, preferably greater than 95%, and most preferably approximately 100% so that the entire useful area of a substrate can be employed for focusing or, more generally, scattering of an illuminating beam.

In connection with these objects, it is also an object of the invention to allow the microlenses of the array to have arbitrary shapes (sag functions) that can vary randomly within the array.

It is a further object of the invention to provide improved methods for using positive photoresists to produce arrays of convex microlenses at high fill factors.

To achieve the foregoing and other objects, the invention provides a fabrication method for producing an array of convex microlenses wherein direct laser writing is used to produce an initial master (initial mold) in a positive photoresist wherein the surface configuration of the initial master is the negative (complement) of the desired array of convex microlenses. That is, the initial master has a concave, instead of a convex, surface configuration. In this way, as discussed in detail below, the problems caused by the finite size of a laser beam and the convolution of such a beam with the desired profile(s) of convex microlenses are overcome. By overcoming these problems, convex microlens arrays having high focusing efficiencies are achieved.

In general, a high focusing efficiency for an array of microlenses depends on two factors: (1) a high fill factor, and (2) accurate reproduction of the desired lens profiles. Both factors are necessary and neither factor alone is sufficient.

Thus, a high fill factor can be achieved by a process that alters all parts of a resist film, but if the alterations do not correspond to the desired lens profiles, the focusing efficiency of the array will still suffer since the parts of the resist film that have the inaccurate profiles will not focus incident light properly. On the other hand, accurate reproduction of a desired lens profile with the individual microlenses spaced far apart also results in low focusing efficiency, in this case as a result of light passing through the spaces between microlenses.

In accordance with the invention, it has been found that both factors can be addressed by using the concave form to initially write convex lenses in a positive photoresist. In this way, high focusing efficiency through the accurate production of desired lens profiles at a high fill factor is achieved.

In accordance with certain preferred embodiments, the invention is practiced by using a substrate typically made of glass to support a first medium to generate an initial master (initial mold), which is later used to accurately replicate the desired microlens array in a cost-effective fashion. More particularly, a photosensitive positive resist film is deposited on the substrate to an appropriate thickness consistent with the desired thickness for the final microlens array. The positive resist is preferably of the low-contrast kind such that, when exposed to light, a smoothly varying surface-relief profile can be produced.

After being deposited on the substrate, the positive resist is exposed to a laser beam having a well-characterized profile. With a pre-defined sampling rate, the area of the resist film of interest is exposed to the laser beam. By varying the intensity of the beam, the complement of the shape of each microlens in the array is encoded in the resist. In particular, the laser exposure produces a latent image in the photosensitive film by modifying its physical and chemical properties.

Next, the film is developed to produce a surface-relief structure. For a resist film of the positive kind, development removes the exposed area leaving the unexposed regions. The above combinations of surface-relief structure and photoresist type for the initial master are critical aspects of the invention since only through the indicated combinations can high focusing efficiencies be achieved through high fill factors and minimized convolution effects of a finite laser beam.

It has been generally believed in the art that the convolution effects of a finite laser beam would be essentially the same irrespective of whether the laser beam exposure created a convex or concave surface-relief structure. In accordance with the invention, it has been found that this belief is not true and in fact by fabricating the initial master for a convex microlens array as a concave surface-relief structure, high fill factors (e.g., fill factors equal to or essentially equal to 100%) and high focusing efficiencies (e.g., focusing efficiencies at least above 75%) are achieved. A detailed discussion of how this combination addresses the convolution problem is presented below.

To create a mold usable in high volume replication, intermediary replication steps are generally necessary because resist films are usually unsuitable for large-volume replication. For example, the concave surface-relief structure can be used to prepare an intermediate master (intermediate mold), which is of convex form. The intermediate master can then be replicated once more to provide a final master (final mold), now in concave form. Large-volume replication is then possible with the final concave master so that the final array has a convex form and provides a high fill factor and a high focusing efficiency.

The array need not be limited to regularly periodic arrangements, such as square or hexagonal arrays, but may assume any general arbitrary form, as dictated by the requirements of the design. Furthermore, the lens shape need not be the same and can, in fact, vary for every microlens in the array. For example, the techniques of the present invention can be used to produce the configurations and distributions of microstructures set forth in the above-referenced, commonly assigned U.S. patent application entitled "Structured Screens for Controlled Spreading of Light."

A fact of importance in the present invention is that the tops of the concavities of the concave surface-relief structure formed in the positive resist film are preferably aligned or vary slowly for any neighboring elements. If this guideline is not satisfied, accurate profiles may only be produced over a portion of the array, reducing both the fill factor and the focusing efficiency of the array.

V. BRIEF DESCRIPTION OF THE DRAWINGS

Figure 10A:
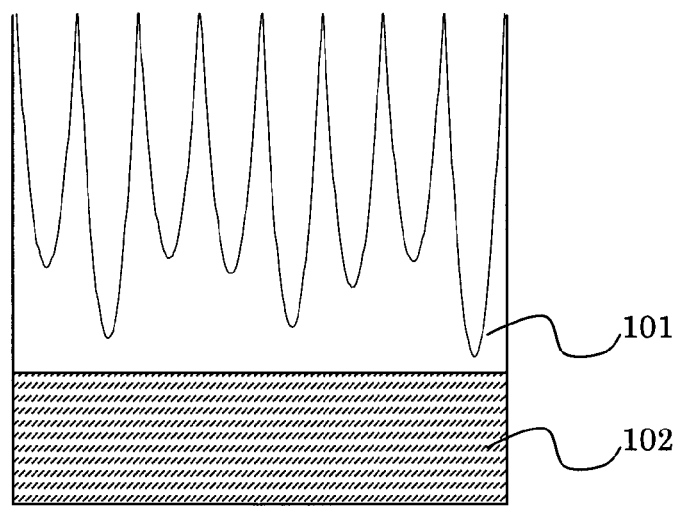
Figure 10B:
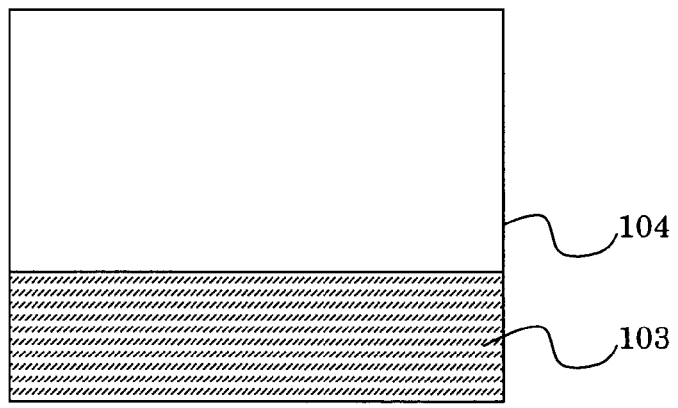
Figure 10C:
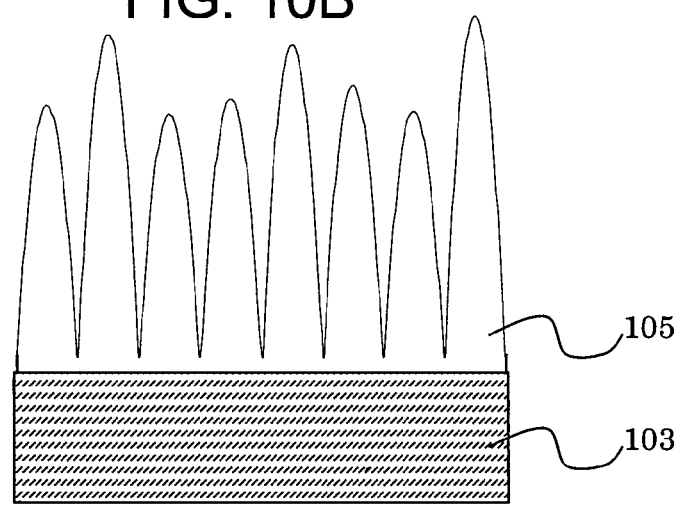

FIG. 10A, FIG. 10B, and FIG. 10C illustrate the replication of an initial mold having concave cavities to obtain a final array of convex microlenses.

VI. DETAILED DESCRIPTION OF THE INVENTION

Figure 1:
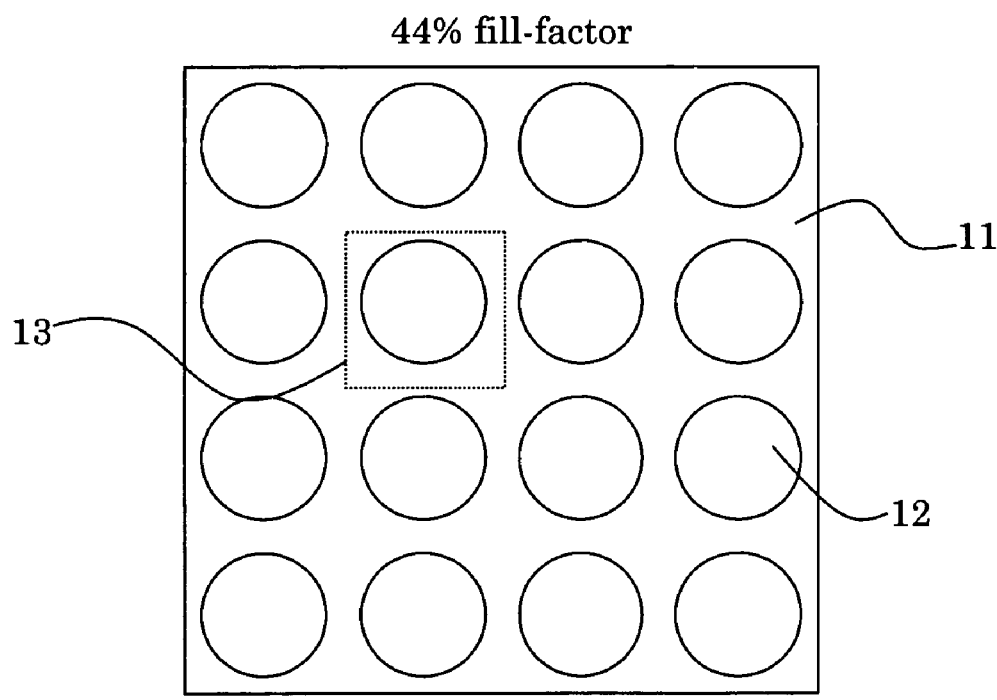
FIG. 1 is a top view of a lens array with a fill factor less than 100%.
Figure 2:
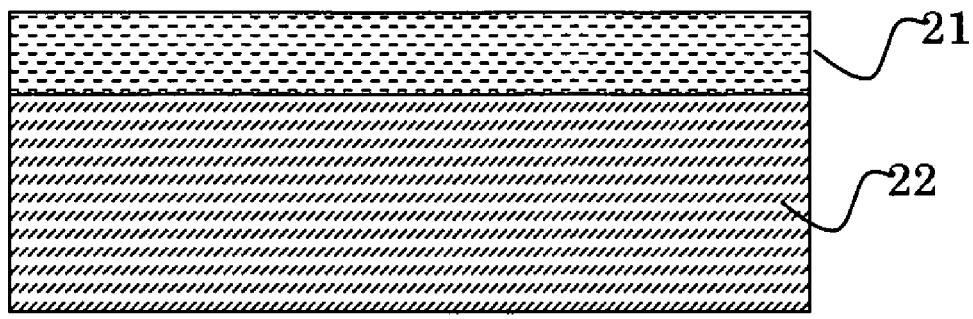
FIG. 2 shows a glass substrate with a photosensitive film deposited on its surface.

Referring now to the figures, FIG. 2 shows a photosensitive resist film 21 of low contrast deposited on a substrate 22 which is typically made of glass. The thickness of the film should be equal to or larger than the total depth span defined by the lens array. Depending on the total thickness of the array, the resist may require preliminary processing such as hardening.

Figure 3:
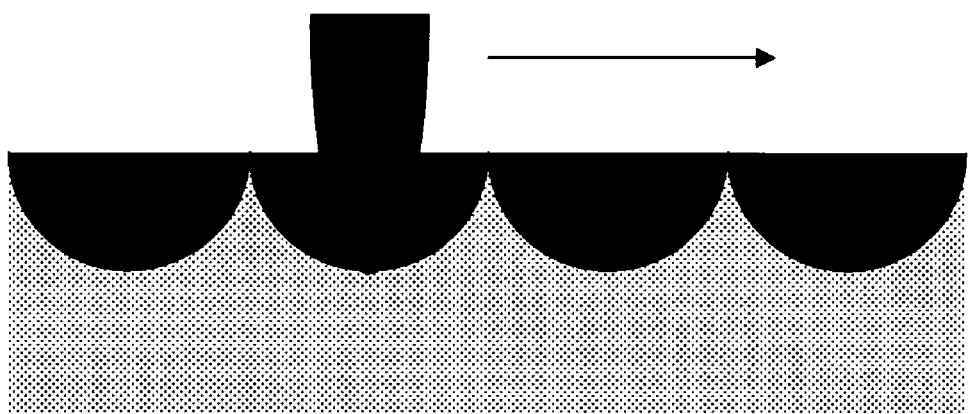
FIG. 3 shows the scanning of a laser beam over a photosensitive film creating a region of distinct chemical properties (latent image).

After the initial resist processing, a laser beam is focused at the resist film and scanned along the surface so as to expose the whole resist surface, as indicated in FIG. 3. The intensity of the laser beam varies for every point in such a fashion that a latent image of the negative of the desired convex microlenses is imprinted in the resist in the form of a chemical transformation of the resist material.

To obtain a surface-relief structure the chemically modified resist film undergoes a development process, which consists of exposure to a solution of, for example, a standard alkali developer for a period of time that varies with the total thickness of the array. Deeper arrays require longer development times. For a resist of the positive type, the development process removes the exposed areas, leaving the unexposed areas.

According to the inventive process described herein, each microlens in the array needs to be produced in the positive photoresist in concave form. Only in this way is it possible to reduce significantly the rounding effect observed when microlenses are fabricated in convex form. This is so because the fabrication process itself introduces features into a surface-relief profile that are undesirable.

Given the mathematical description of the desired surface-relief structure and the writing laser beam, the relief structures obtained by exposure of a resist film are generally described as the convolution of the desired surface function with the laser beam function. The operation of convolution can be mathematically described by the following relation:

$$F(x, y) = \int\int_s f(x', y')g(x' - x, y' - y)dx'dy', \quad (1)$$

where f represents the mathematical function describing the desired surface relief, g represents the mathematical form of the writing laser beam, S represents the fabricated surface area, (x,y) denotes a point on the surface of the photosensitive film, and F represents the final surface shape.

Figure 4A:
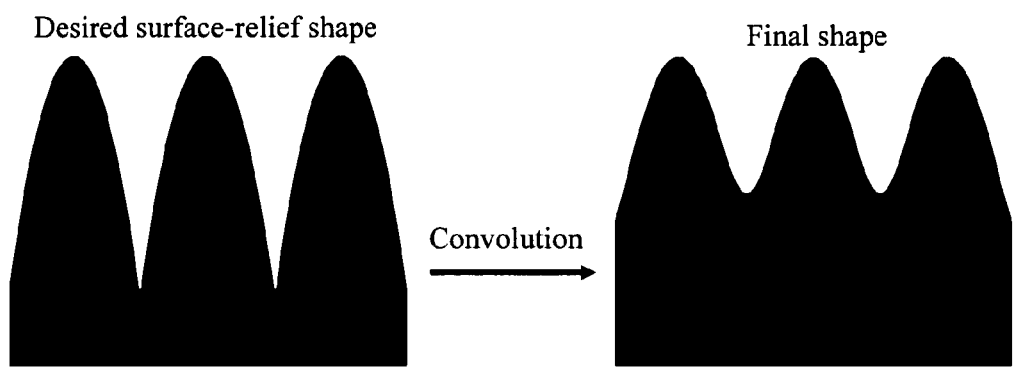
FIG. 4A and FIG. 4B show the effect of convolution in the fabrication of convex structures.
Figure 4B:
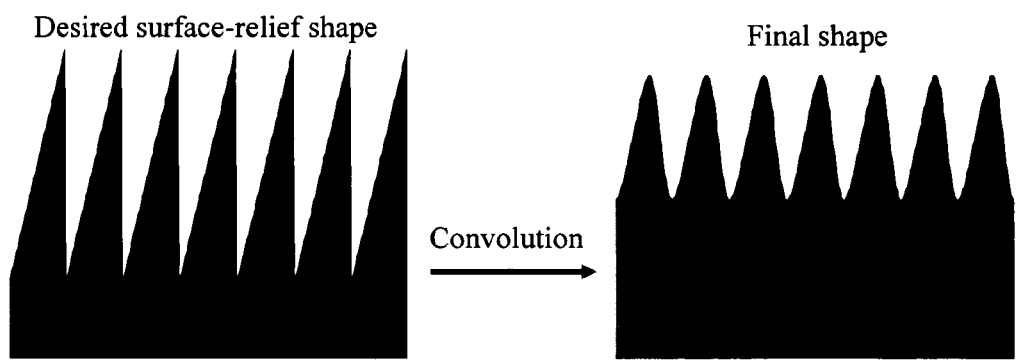

The validity of Eq. (1) relies on the assumption that the interaction of the laser beam and the photosensitive film is linear, in the sense that the response of the film is in direct proportionality to the intensity of the laser exposure and that the superposition of several beams has a simple additive effect. To a good approximation this assumption is correct and can be observed in surface-relief structures fabricated in convex form, that is, structures that protrude from the resist surface as illustrated in FIGS. 4A and 4B.

The fact that the expected convolution effects are readily observed in convex structures has led to the general belief that the same type of behavior would happen for concave shapes. In fact, if one uses Eq. (1), and notes that to obtain the concave shape one simply needs to multiply the convex shape by −1 and add a constant, then it would appear that the final shape should be the same for both the concave and the convex shapes, except for the change in sign.

However, it turns out that the interaction between the laser beam and the photosensitive film is not linear and, therefore, the convolution relation can describe the fabrication process only approximately. In fact, in accordance with the invention, we have discovered that the laser writing process is more akin to the fabrication of devices by means of hard mechanical apparatuses such as diamond tools.

Figure 5A:
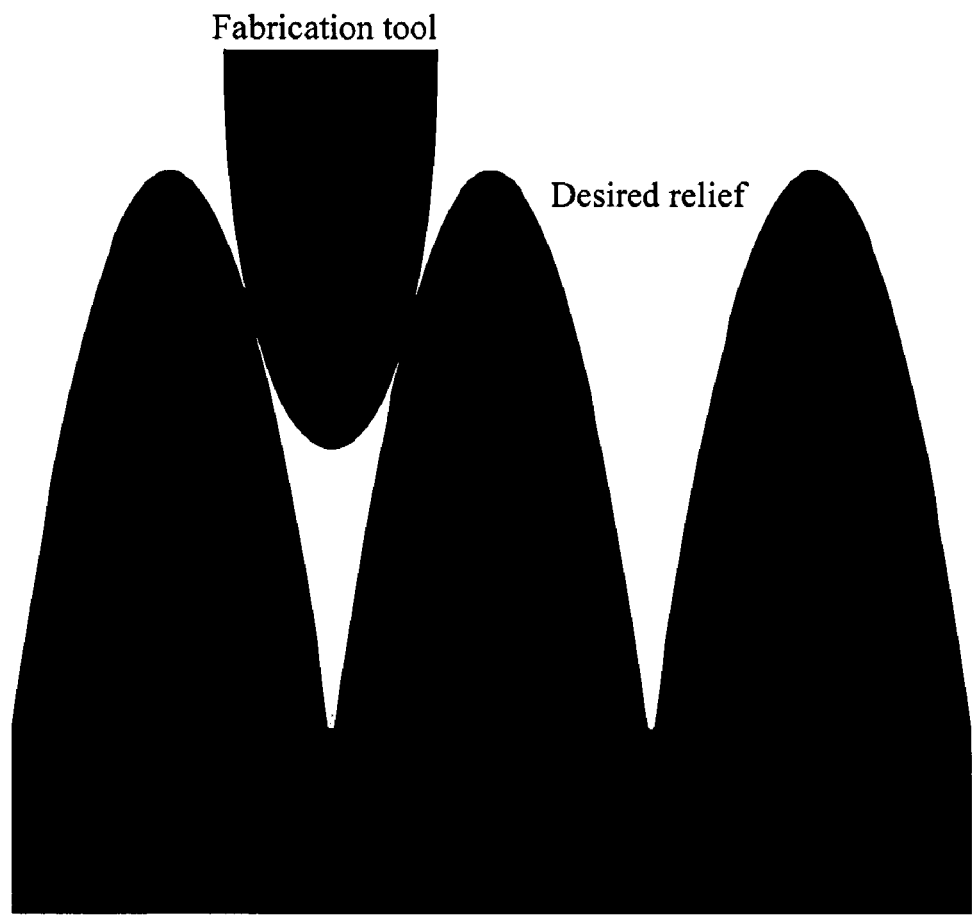
FIG. 5A and FIG. 5B illustrate the interaction of a hard fabrication tool in relation to a convex and concave array, respectively.
Figure 5B:
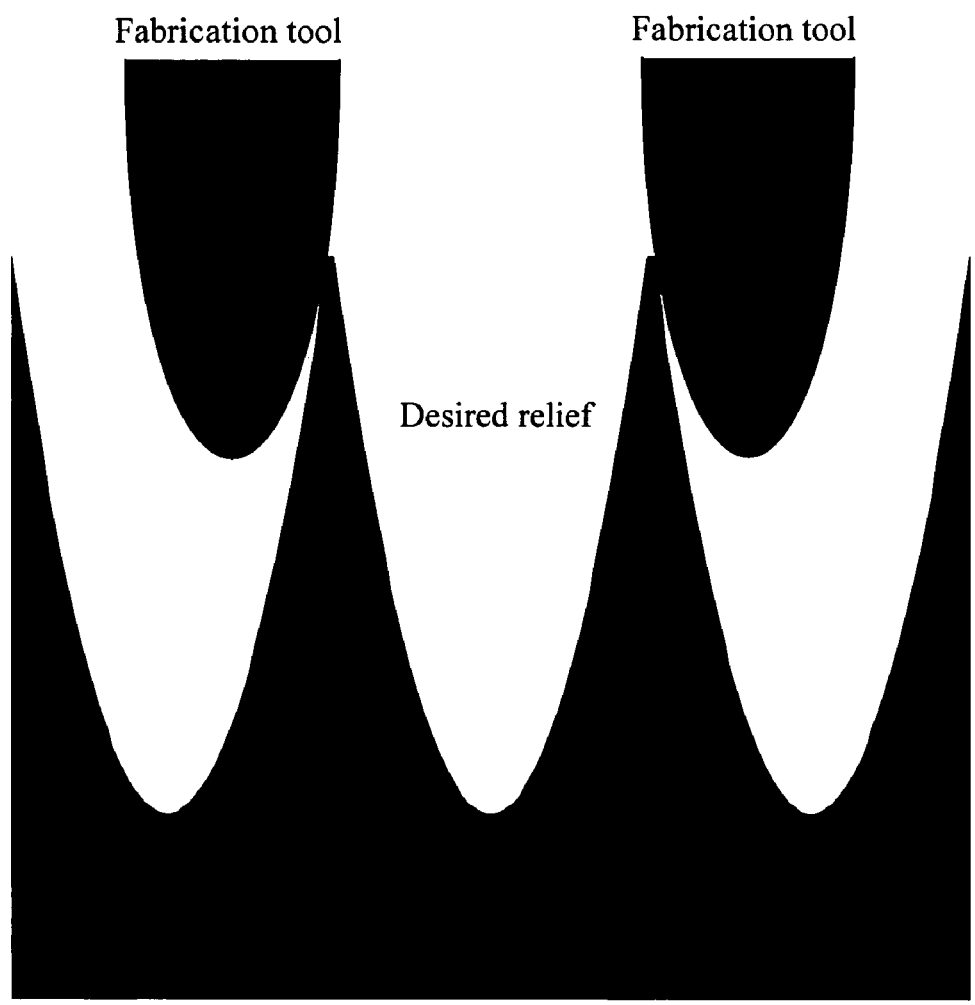

In such fabrications, convolution effects are still present but they are of a different nature than those observed with a laser beam because latent image-formation is nonexistent and superposition effects do not occur. It is the contact of the mechanical tool with the surface being ruled that creates the surface relief. There is, however, an intrinsic asymmetry in the mechanical fabrication of convex and concave structures. Because of the finite size of the tool, it is not possible to penetrate the narrow region between two neighboring structures, but there is no difficulty in creating the sharp contact point of two concave structures. This is illustrated in FIGS. 5A and 5B.

In accordance with the invention, we have found that the laser writing process operates according to similar principles and exhibits similar asymmetry when considering convex and concave shapes. This surprising result enables the fabrication of fully-packed convex microlens arrays, as opposed to previous methods that can only guarantee accurate profiles over a fraction of the aperture of the array in a fully-packed arrangement.

Importantly, the laser-writing process when used to make concave surface-relief structures not only achieves the advantage of mechanical ruling devices for concave structures but also offers significant capabilities that go beyond those of mechanical ruling methods. For instance, there is virtually no limitation regarding the size or shape of microlenses made with the laser-writing process. Also, the size of the mechanical tool itself determines the extent of the boundary region between neighboring microlenses. With laser writing, this region can be arbitrarily reduced.

The ability to preserve a concave surface-relief shape from the apex of the structure to its very edge at the boundary of a neighboring concavity allows for the fabrication of arrays of convex microlenses of high focusing efficiency. It does so since it allows the final convex microlenses to have a fully-packed arrangement. In contrast, if the array is directly produced in convex form, independent of whether one uses a mechanical tool, a laser tool, or other process, the boundaries of two neighboring microlenses cannot be usefully employed for focusing and thus the array will have a reduced focusing efficiency.

Figure 6:
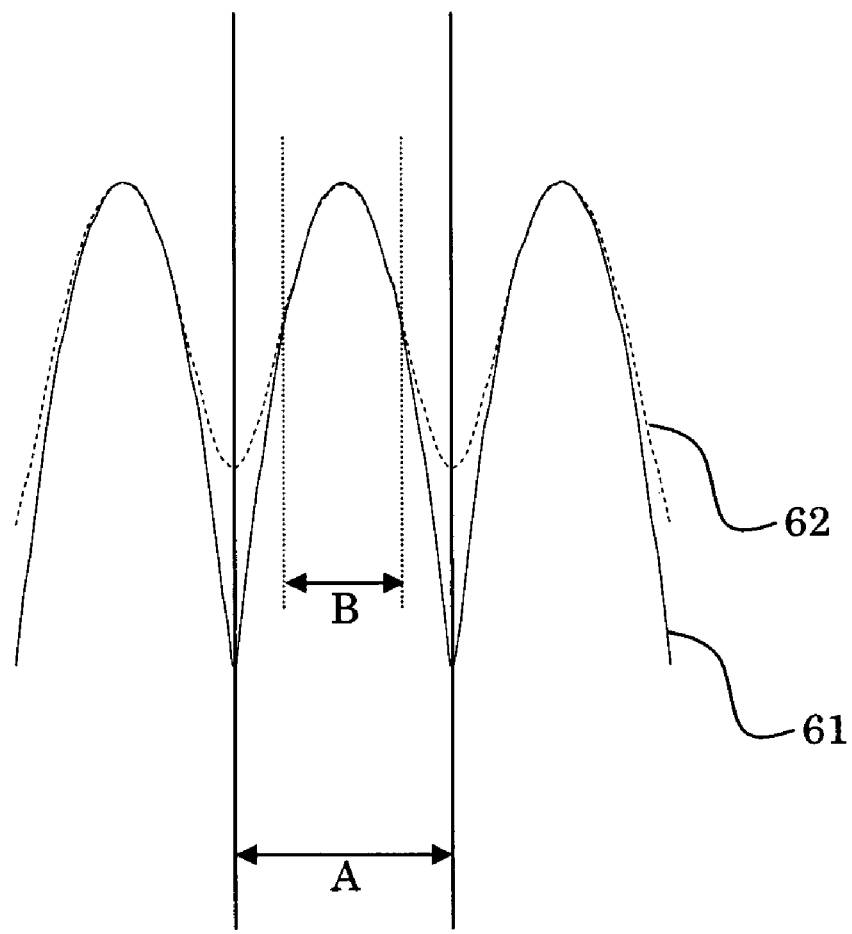
FIG. 6 illustrates a technique for estimating the focusing efficiency of the microlens units of an array fabricated in convex form.

This deficiency of producing an array in convex form, whether by means of a mechanical or a laser tool, is illustrated in FIG. 6. In this figure, the desired microlens shape is represented by curve 61 with an area available for focusing represented by the parameter A. However, due to the fabrication, the actual microlens shape turns out be that given by curve 62 and the area available for focusing now being represented by the parameter B. The observed rounding effect at the boundaries of the microlenses diverts the incident illumination to locations other than the focal point of the microlens. Therefore, only area B becomes available for focusing. In this way, the estimated focusing efficiency of the microlens ρ can be written as $$\eta = \left(\frac{B}{A}\right)^2 \times 100\%. \tag{2}$$

With the prior art, B is always less than A so that the focusing efficiency is less than 100%. With the current inventive process, the initial surface-relief structure is written in concave form so that sharp boundaries between lenses are well reproduced in the final microlens array. When the concave master is replicated one obtains a convex array such that B essentially equals A. Consequently the focusing efficiency is essentially 100%.

Figure 7A:
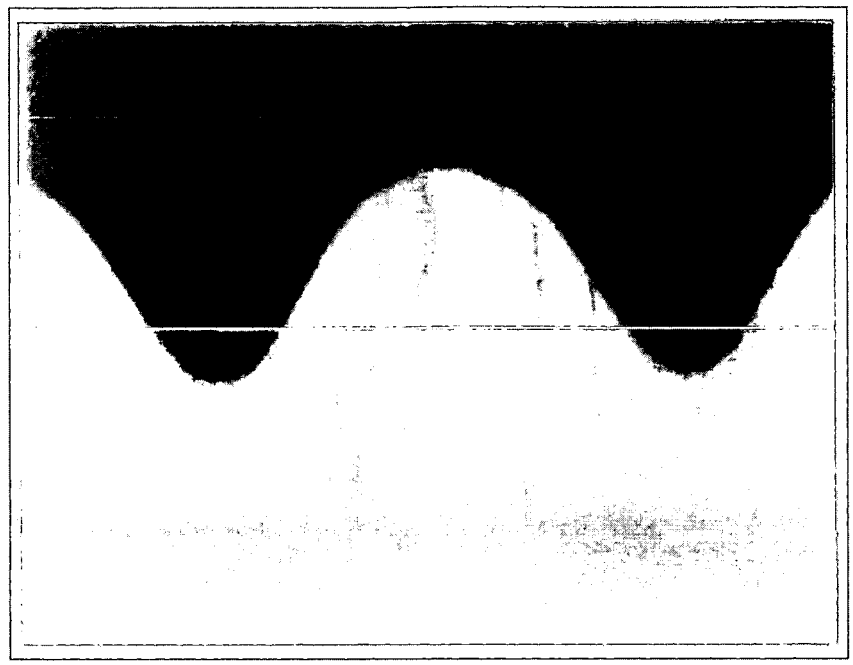
FIG. 7A and FIG. 7B show experimental plots of identical microlens profiles fabricated in convex and concave forms, respectively.

Experimental studies have confirmed the above analysis, especially in the case of convex microlenses of high numerical aperture (fast lenses) where light is focused at large angles. FIG. 7A shows the case of an array of microlenses with diameter equal to 50 μm fabricated in convex mode. The boundaries between microlenses are clearly rounded and cannot be efficiently used for focusing. The estimated efficiency for each microlens in this array is 50%.

Figure 7B:

On the other hand, when the same array is fabricated in concave form one obtains a far better result, as shown in FIG. 7B. Note that the boundaries are preserved. This array is estimated to be 100% efficient in focusing. In addition the concave surface-relief structure can be fully packed without losing efficiency. Direct writing of a convex array cannot achieve such packing without loss of efficiency.

Figure 8:
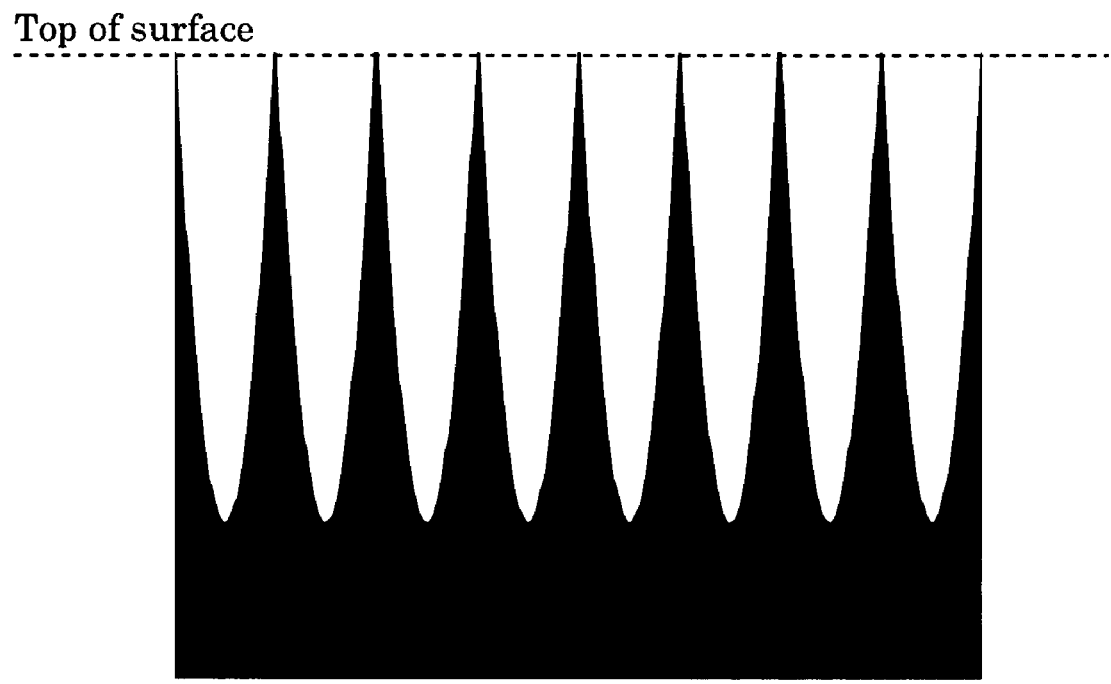
FIG. 8 and FIG. 9 illustrate surface-relief structures having concave cavities formed in a positive photoresist where the edge boundaries of the cavities are aligned with the top surface of the photoresist.

As another important component of the present inventive process, the concavities of the concave surface-relief structure formed in the positive photoresist should have their extremities aligned with the surface of the resist as indicated in FIG. 8. Any variations from the desirable alignment should be slow enough so as to avoid excessive rounding of the ultimate microlenses that would lead to low transmission efficiency. The analogy between the mechanical ruling and the laser writing starts to fail when neighboring concavities present a relative vertical offset, such as, the "piston" of the above-referenced, commonly assigned patent application entitled "Structured Screens for Controlled Spreading of Light." For some types of screen applications, the reduced efficiency might be acceptable. In other cases, the loss in focusing efficiency is intolerable.

Figure 9:
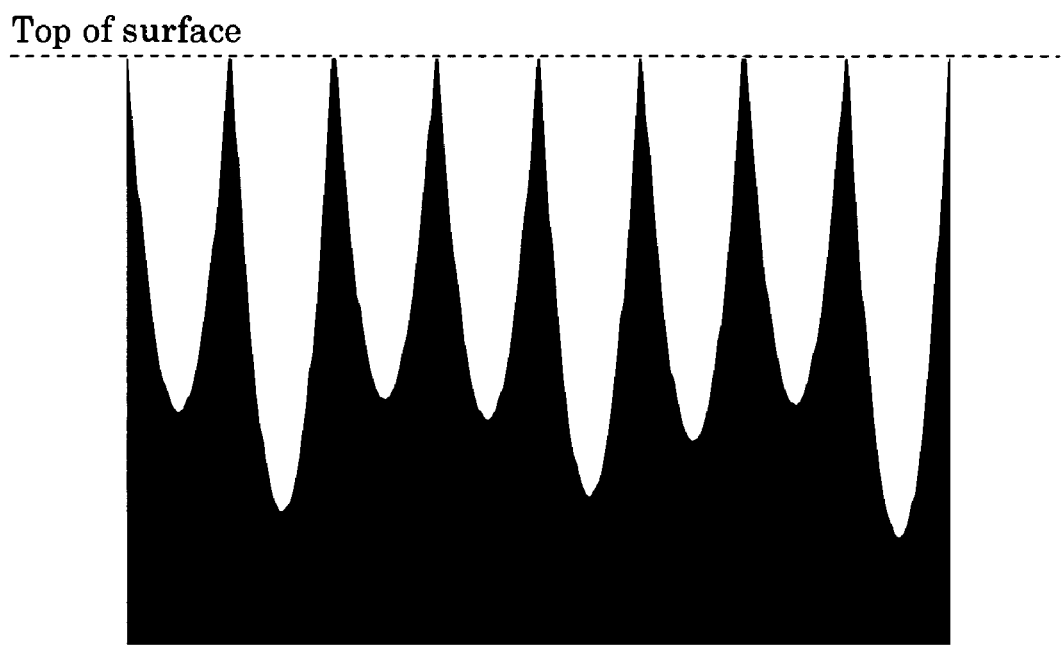

As shown in FIG. 9, the requirement of alignment between the top of the concavities of the concave surface-relief structure is fully compatible with the requirement of some arrays that the focusing properties of the individual microlenses vary randomly. In this case, the vertices of the concavities do not align, only their tops. A similar principle applies for two dimensional arrays.

After development, the surface-relief structure obtained with the laser exposure provides a first mold that can be used for replication. If the material that constitutes the photosensitive film is suitable for replication, than replicas of that master can be readily fabricated in convex form. If Other methods, such as those described in U.S. Pat. No. 5,300,623, involve the creation of mechanical molds that define receptacles for curable liquids. The liquid is poured into the receptacles and the natural surface tension creates a bowed surface that serves as the microlenses. The mold, with the various receptacles, defines the array arrangement. Due to the inherent limitation of this method in controlling the shape of the microlens units, its efficiency cannot be optimized for a general application. Other mechanical methods based on the direct ruling of individual microlenses, such as diamond turning, are better suited for the fabrication of individual microlenses rather than arrays. concave replicas are required, an intermediate replication step is necessary whereby a convex tool is formed, which is ready to produce concave arrays. Typically, the photosensitive film is not suitable for many replications and, as a result, molds are preferably made of, for example, stronger plastic resins.

A representative replication process is illustrated by the sequence shown in FIG. 10A through FIG. 10C.

FIG. 10A shows the initial surface-relief structure 101 in concave form with the tops aligned. The substrate, e.g., glass substrate, is identified by the reference number 102. FIG. 10B shows another substrate 103 on which a plastic resin 104 has been deposited. This resin will be one more suitable than a photoresist for use or as an intermediate replication tool. FIG. 10C shows the result of replication of the intermediate replication tool of FIG. 10B to generate the desired array of convex microlenses 105.

Sequences similar to that shown in FIG. 10 can be used to make high efficiency, high fill factor arrays of concave microlenses with again the initial surface-relief structure being formed in a positive photoresist in concave form.

Although specific embodiments of the invention have been described and illustrated, it will be apparent to those skilled in the art that modifications and variations can be made without departing from the invention's spirit and scope. The following claims are thus intended to cover the specific embodiments set forth herein as well as such modifications, variations, and equivalents.

What is claimed is:

1. A microlens array comprising a plurality of unit cells and a plurality of microlenses, one microlens per unit cell, wherein:
   (a) the unit cells are close packed;
   (b) the array has a fill factor of at least 95 percent;
   (c) the array has a focusing efficiency of at least 75 percent; and
   (d) at least two of the microlenses differ from one another randomly.

2. The microlens array of claim 1 wherein the array has a focusing efficiency of at least 85 percent.

3. The microlens array of claim 1 wherein the array has a focusing efficiency of at least 95 percent.

4. The microlens array of claim 1 wherein the array has a fill factor substantially equal to 100 percent.

5. The microlens array of claim 1 wherein the microlenses are convex microlenses.

6. The microlens array of claim 1 wherein at least some of the microlenses are anamorphic.

* * * * *